(12) United States Patent
Maeshiba

(10) Patent No.: US 10,091,901 B2
(45) Date of Patent: Oct. 2, 2018

(54) AIR SHELTER FOR ELECTRICAL EQUIPMENT

(71) Applicant: SHOWA KIKI KOGYO CO., LTD., Fukuoka (JP)

(72) Inventor: Shinsuke Maeshiba, Fukuoka (JP)

(73) Assignee: SHOWA KIKI KOGYO. CO. LTD., Fukuoka (JP)

( * ) Notice: Subject to any disclaimer, the term of this patent is extended or adjusted under 35 U.S.C. 154(b) by 0 days.

(21) Appl. No.: 15/690,415

(22) Filed: Aug. 30, 2017

(65) Prior Publication Data
US 2018/0116062 A1    Apr. 26, 2018

(30) Foreign Application Priority Data

Oct. 24, 2016  (JP) ................................ 2016-207561

(51) Int. Cl.
  *H05K 5/06* (2006.01)
  *H02G 3/06* (2006.01)
  *H05K 5/03* (2006.01)

(52) U.S. Cl.
  CPC .......... *H05K 5/069* (2013.01); *H02G 3/0616* (2013.01); *H05K 5/03* (2013.01)

(58) Field of Classification Search
  CPC ......... H05K 5/069; H05K 5/03; H02G 3/0616
  USPC ....................................................... 174/50
  See application file for complete search history.

(56) References Cited

U.S. PATENT DOCUMENTS

| 7,469,682 | B2* | 12/2008 | Anderson | F02M 69/54 123/457 |
| 7,811,509 | B2* | 10/2010 | Vild | C22B 9/05 266/216 |
| 8,137,557 | B2* | 3/2012 | Ladouceur | B01F 3/04248 210/615 |
| 9,966,745 | B2* | 5/2018 | Wentworth | H02G 3/088 |
| 2015/0322941 | A1 | 11/2015 | Maeshiba | |

FOREIGN PATENT DOCUMENTS

| JP | 5760598 B2 | 8/2015 |
| JP | 5951020 B2 | 7/2016 |

* cited by examiner

*Primary Examiner* — Dhirubhai R Patel
(74) *Attorney, Agent, or Firm* — Paul D. Bianco; Fleit Gibbons Gutman Bongini & Bianco PL

(57) ABSTRACT

To completely prevent air from leaking out from a conduit tube, which protects an electrical wire connecting an electrical equipment and a power source, and to easily and reliably electrically connect the electrical equipment and the power source in an air shelter. A pump and a motor are covered with a cover body, and an electrical wire that connects an explosion proof connector and a power source is not protected with a flexible conduit tube in the inside of the cover body, and protected with the flexible conduit tube only on the outer side of a conduit tube connector arranged on a side wall of a base.

4 Claims, 3 Drawing Sheets

AIR SHELTER FOR ELECTRICAL EQUIPMENT

BACKGROUND OF THE INVENTION

1. Field of the Invention

The present invention relates to an air shelter for an electrical equipment that prevents an electrical equipment such as a motor from being submerged at the time of flooding by heavy rain, flood, tsunami, and the like.

2. Description of the Related Art

The applicant was granted a patent on a submergence preventing structure of an equipment that can prevent submergence of the equipment and can escape generated heat and oil vapor from the equipment (Japanese Patent Publication No. 5951020).

In this patent, an opening (61) is provided only at a bottom surface portion and a lower side of a side surface portion of a sealed box (60), and hence an interior of the sealed box is constantly communicated with outside air and the generated heat and the oil vapor from the equipment such as a pump (20) can be escaped, and furthermore, an excellent effect is obtained in that, even if the sealed box (60) is submerged, an air reservoir is formed in the sealed box so that the equipment can be prevented from being submerged by arranging the equipment in a region to become the air reservoir.

However, when the air reservoir is formed in the sealed box, the air leaks out to the outside from the air reservoir through a conduit tube, which protects an electrical wire connecting the equipment and a power source, and an occurrence of a phenomenon in which the equipment is submerged is confirmed.

The applicant thereafter found out that a technique for preventing air in a case from leaking to the outside little by little from an external line cable including a cable sheath and an electrical wire by filling a gap between the cable sheath and the electrical wire with resin has been proposed in patent document 2 (Japanese Patent Publication No. 5760598), and conducted an experiment of filling the gap between the conduit tube and the electrical wire with resin.

The leakage of air can be prevented for a period of a certain extent by filling the gap with resin, but the air leakage occurs when the resin is degraded after elapse of a long period from when the gap is filled with resin, and furthermore, the air leakage occurs when the submerged depth is deep and a considerable water pressure is exerted on the resin portion thus breaking the resin and forming a gap from the water pressure even by a slight degradation of resin.

CITED DOCUMENT

Patent Document

[Patent document 1] Japanese Patent Publication No. 5951020

[Patent document 2] Japanese Patent Publication No. 5760598

SUMMARY OF THE INVENTION

A first problem to be solved by the present invention is to completely prevent the air from leaking out from a conduit tube, which protects an electrical wire connecting an electrical equipment and a power source, in a submergence preventing facility (air shelter).

Furthermore, a second problem is to be able to easily and reliably electrically connect the electrical equipment and the power source while completely preventing the leakage of air from the conduit tube.

An invention according to claim 1 for solving the problem described above relates to an air shelter for an electrical equipment including an equipment operated by power, a cover body arranged at a periphery of the equipment to prevent submergence of the equipment, an electrical wire that supplies the power to the equipment, and a conduit tube that protects the electrical wire; where the cover body has at least a roof portion, a side surface portion, and a bottom surface portion, and includes an opening at one part or all of the bottom surface portion or on a lower side of a position where the equipment is arranged in the side surface portion, the other portions being a sealed structure; and the electrical wire is passed through a vicinity of a lower end of the side surface portion or the bottom surface portion of the cover body from the equipment and connected to a power source; and the conduit tube includes a terminating end, a discontinuous portion, or a portion having permeability on a lower side of a position where the equipment is arranged in the inside or the lower side of the cover body.

The invention according to claim 2 for solving the problem described above relates to the air shelter for the electrical equipment of the invention according to claim 1, where an end of the conduit tube or a member connected to the end of the conduit tube is water tightly filled.

The invention according to claim 3 for solving the problem described above relates to the air shelter for the electrical equipment of the invention according to claim 1 or 2, further including a conduit tube connector for connecting a terminating end of the conduit tube in the vicinity of a lower end of the side surface portion or the vicinity of the bottom surface portion of the cover body.

DETAILED DESCRIPTION OF THE PREFERRED EMBODIMENTS

According to the invention of claim 1, in an air shelter for an electrical equipment including an equipment operated by power, a cover body arranged at a periphery of the equipment to prevent submergence of the equipment, an electrical wire that supplies the power to the equipment, and a conduit tube that protects the electrical wire; the cover body has at least a roof portion, a side surface portion, and a bottom surface portion, and includes an opening at one part or all of the bottom surface portion or on a lower side of a position where the equipment is arranged in the side surface portion, the other portions being a sealed structure; and the electrical wire is passed through a vicinity of a lower end of the side surface portion or the bottom surface portion of the cover body from the equipment and connected to a power source; and the conduit tube includes a terminating end, a discontinuous portion, or a portion having permeability on a lower side of a position where the equipment is arranged in the inside or the lower side of the cover body, so that when the lower side of the position where the equipment is arranged in the cover body is submerged and the air pressure of the air reservoir formed at the periphery of the equipment is increased thus creating an air pressure difference with the outside pressure, the air will not leak out to the outside from the air reservoir through the conduit tube and the equipment will not be submerged.

According to the invention of claim 2, in addition to the effect of the invention of claim 1, the end of the conduit tube or the member connected to the end of the conduit tube is water tightly filled and thus the water does not enter inside when the conduit tube is submerged, whereby the degradation of the electrical wire in the conduit tube can be prevented.

According to the invention of claim 3, in addition to the effects of the invention of claim 1 or 2, the conduit tube connector for connecting the terminating end of the conduit tube is arranged in the vicinity of the lower end of the side surface portion or the vicinity of the bottom surface portion of the cover body, whereby the conduit tube and the electrical wire can be easily installed.

Hereinafter, embodiments of the present invention will be described with the following embodiments.

[Embodiment 1]

Figure 1:
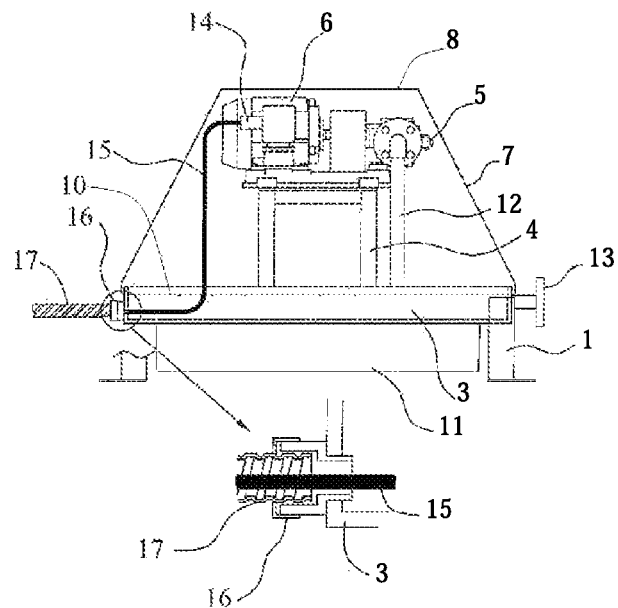
FIG. 1 is a front view of an air shelter for an electrical equipment according to embodiment 1.
Figure 2:
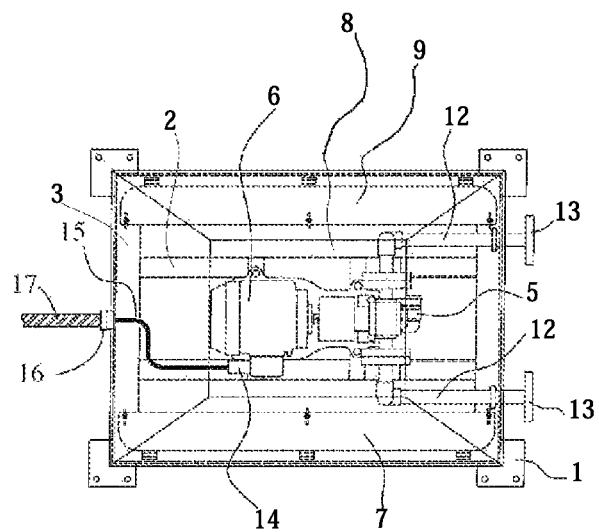
FIG. 2 is a plan view of the air shelter for the electrical equipment according to embodiment 1.

FIG. 1 is a front view of an air shelter for an electrical equipment according to embodiment 1, and FIG. 2 is a plan view thereof.

FIGS. 1 and 2 show an overall configuration of the air shelter for the electrical equipment, where a base 3 having a rectangular shape and including a beam 2 is installed on four base frames 1, a pump frame 4 is installed on the beam 2, a pump 5 and a motor 6 are mounted on an upper surface of the pump frame 4, and a cover body 7 that covers the pump frame 4, the pump 5, and the motor 6 is fixed on the base 3 in a freely opening/closing manner so as not to submerge the motor 6, and the like at the time of flood, and the like.

The cover body 7 has a rectangular shape of substantially the same size as the outer peripheral part of the base 3 in plan view, and includes a roof portion 8, a side surface portion 9, and a bottom surface portion 10, and has an outer shape formed to a truncated pyramid shape.

The roof portion 8 and the side surface portion 9 are made from a material (metal plate etc.) that does not permeate air and are joined so that air does not escape from the seam, and the bottom surface portion 10 has substantially the entire surface opened.

A shielding float 11 connected by a hinge (not shown) is provided under one side of the bottom surface portion 10.

Thus, at the normal time, the shielding float 11 is located on the lower side by its own weight and thus the inside of the cover body 7 is communicated with the outside, but when a water level is increased, the shielding float 11 is moved in a direction of closing the bottom surface portion 10 by buoyancy thus reducing the force of water entering from the opening.

However, the shielding float 11 does not completely close the opening, and thus the water gradually enters the inside of the cover body 7 when the water level exceeds the bottom surface portion 10, where an inner pressure of the air reservoir formed in the inside of the cover body 7 rises the higher the water level, and the motor 6, and the like can be prevented from flooding.

In particular, the height dimension of the air reservoir can be ensured and the force of the water flow in the horizontal direction due to tsunami, flood, and the like can be parried by having the interior space of the cover body 7 formed to sequentially become narrower toward the upper side as in embodiment 1.

Furthermore, since the cover body 7 has one side of the bottom surface portion 10 connected to one side of the base 3 with a hinge (not shown), the cover body 7 can be turned and opened with the hinge as the center when carrying out maintenance and inspection of the pump 5 and the motor 6.

The pump 5 is driven by the motor 6 and has a piping 12 on an upstream side and a downstream side.

A flange 13 for connecting with an introducing tube and a discharging tube (not shown) is provided at the entrance and the exit of the piping 12.

Furthermore, the motor 6 includes an explosion proof connector 14, which explosion proof connector 14 and a power source (not shown) are connected with an electrical wire 15 to supply power to the motor 6.

The conduit tube is not attached to the electrical wire 15 in the inside and the lower side of the cover body 7, and the electrical wire 15 is protected by a flexible conduit tube 17 after being passed through a hole formed at one area in the side wall of the base 3 and a conduit tube connector 16.

According to such configuration, the air is prevented from leaking out to the outside from the air reservoir through the conduit tube and the equipment can be completely prevented from being submerged.

[Embodiment 2]

Figure 3:
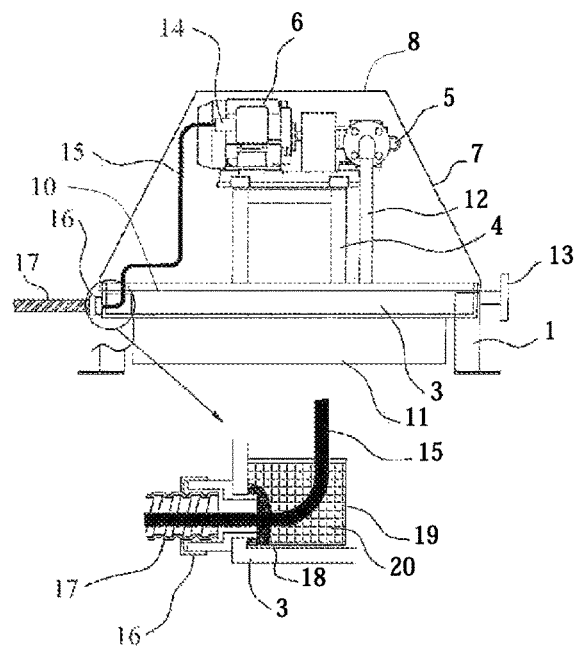
FIG. 3 is a front view of an air shelter for an electrical equipment according to embodiment 2.
Figure 4:
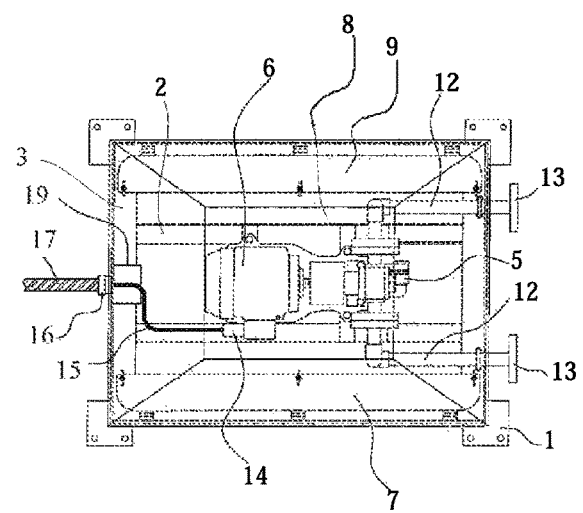
FIG. 4 is a plan view of the air shelter for the electrical equipment according to embodiment 2.

FIG. 3 is a front view of an air shelter for an electrical equipment according to embodiment 2, and FIG. 4 is a plan view thereof.

The difference with embodiment 1 merely lies in that a devisal has been made so that the water does not enter inside the flexible conduit tube 17 when the water level exceeds the conduit tube connector 16, and thus in the following description, the same reference numbers as embodiment 1 are used for the same components as embodiment 1, and the same reference numbers as FIGS. 1 and 2 are denoted on FIGS. 3 and 4.

The characteristic of embodiment 2 lies in that on the inner side of the base 3 where the conduit tube connector 16 is arranged, an end of the conduit tube connector 16 is covered with clay 18, a caulking box 19 is arranged at the periphery thereof, and a caulking material 20 is flowed into the caulking box 19 to prevent the water from entering inside the flexible conduit tube 17.

[Embodiment 3]

Figure 5:
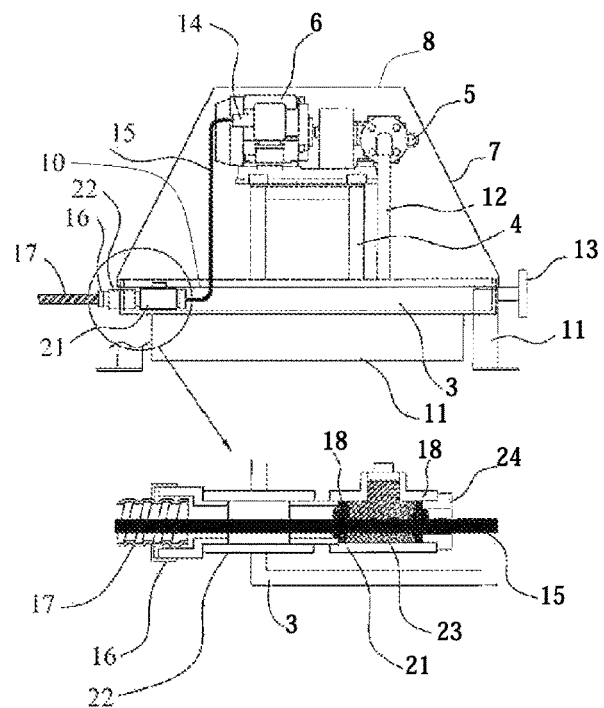
FIG. 5 is a front view of an air shelter for an electrical equipment according to embodiment 3.
Figure 6:
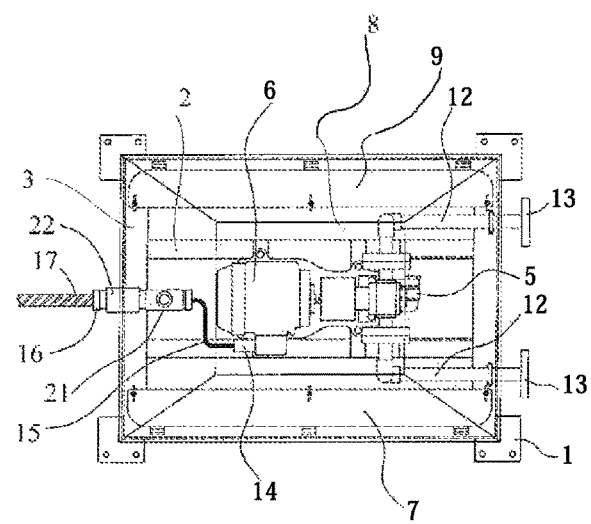
FIG. 6 is a plan view of the air shelter for the electrical equipment according to embodiment 3.

FIG. 5 is a front view of an air shelter for an electrical equipment according to embodiment 3, and FIG. 6 is a plan view thereof.

The different with embodiment 1 merely lies in that a devisal has been made so that the water does not enter inside the flexible conduit tube 17 when the water level exceeds the conduit tube connector 16, and thus in the following description, the same reference numbers as embodiment 1 are used for the same components as embodiment 1, and the same reference numbers as FIGS. 1 and 2 are denoted on FIGS. 5 and 6.

The characteristic of embodiment 3 lies in that a coupling 22 for connecting the conduit tube connector 16 and a sealing fitting 21, which water tightly protects the electrical wire 15, is arranged on a side wall of the base 3 to facilitate the installation of the conduit tube connector 16, a compound 23 is flowed into the sealing fitting 21 through which the electrical wire 15 passes and furthermore, both sides are closed with clay 18 and the clay 18 is held down with a bushing 24 to prevent the water from entering inside the flexible conduit tube 17.

Variants related to the air shelter for the electrical equipment of embodiments 1 to 3 are listed below.

(1) The object of embodiments 1 to 3 is to prevent flooding of the motor 6, but embodiments are effective in installing, not limited to the motor, the electrical equipment that may stop its operation or may malfunction when flooded.

(2) In embodiments 1 to 3, the cover body 7 is fixed in a freely opening/closing manner on the base 3, but may not be openable/closable.

In this case, an openable/closable or a detachable lid or an entrance/exit opening is preferably provided on the roof portion 8 or the side surface portion 9 for maintenance and inspection of the pump 5 and the motor 6.

(3) In embodiments 1 to 3, the cover body 7 has a truncated pyramid shape including the roof portion 8 and the side surface portion 9, but may be any shape such as a pyramid shape, square column shape, circular column shape, semicircular column shape, and the like.

(4) In embodiments 1 to 3, the shielding float 11 is arranged under the bottom surface portion 10, but the shielding float may not be arranged as the air reservoir is formed even if the shielding float 11 is not arranged.

(5) In embodiments 1 to 3, substantially the entire surface of the bottom surface portion 10 is opened, but one part of the bottom surface portion 10 may be opened, or one part on the lower side of the position where the motor 6 is arranged in the side surface portion may be opened.

(6) In embodiments 1 to 3, the electrical wire 15 is passed through the hole provided at one area in the side wall of the base 3 and the conduit tube connector 16 and connected to the power source, but merely needs to be passed through the vicinity of the lower end of the side surface portion 9 or the bottom surface portion 10 of the cover body 7 and connected to the power source.

(7) In embodiments 1 to 3, the explosion proof connector 14 side of the electrical wire 15 is not protected with the conduit tube, but an area between the explosion proof connector 14 and the flexible conduit tube 17 may be protected with a conduit tube having a cut or permeability at least at one part.

However, the portion having the cut or permeability needs to be on the lower side of the position where the motor 6 is arranged in the inside or the lower side of the cover body 7, and preferably on the lower side of the position at the upper side of the bottom surface portion 10 where the air reservoir is usually formed and the difference with the outside pressure does not become too large.

(8) In embodiments 1 to 3, a terminating end of the flexible conduit tube 17 is connected to the conduit tube connector 16 arranged near an upper edge of the base 3, and only the electrical wire 15 is extended to the explosion proof connector 14 therefrom, but the flexible conduit tube 17 may be extended to the lower side of the position where the motor 6 is arranged in the inside or the lower side of the cover body 7, for a reason same as (7) described above.

In other words, the flexible conduit tube 17 merely needs to have a terminating end, a discontinuous portion, or a portion having permeability on the lower side of the position where the motor 6 is arranged in the inside or the lower side of the cover body 7.

(9) In embodiments 1 to 3, the conduit tube connector 16 is arranged on the side surface portion or near the side surface portion of the base 3, but may be installed anywhere as long as it is an area where the flexible conduit tube 17 can be easily connected such as the vicinity of the lower end of the side surface portion 9, the vicinity of the bottom surface portion 10, and the like of the cover body 7.

(10) In embodiments 1 to 3, the explosion proof connector 14 and the power source are connected with the electrical wire 15, but the motor 6 and the power source may be connected without interposing the explosion proof connector 14, and a power generator may be installed on the pump frame 4 so that power can be supplied from the power generator to the motor 6 in case electricity cannot be supplied from the power source.

(11) The water is prevented from entering inside the flexible conduit tube 17 by covering the end of the conduit tube connector 16 with the clay 18, arranging the caulking box 19 at the periphery thereof and flowing the caulking material 20 into the caulking box 19 in embodiment 2, and by flowing the compound 23 into the sealing fitting 21, closing both sides with the clay 18 and holding down the clay 18 with the bushing 24 in embodiment 3, but such structures are not the sole case, and the end of the flexible conduit tube 17 or the member connected to the end of the flexible conduit tube 17 merely needs to be water tightly filled.

DESCRIPTION OF SYMBOLS

1 Base frame
2 Beam
3 Base
4 Pump frame
5 Pump
6 Motor
7 Cover body
8 Roof portion
9 Side surface portion
10 Bottom surface portion
11 Shielding float
12 Piping
13 Flange
14 Explosion proof connector
15 Electrical wire
16 Conduit tube connector
17 Flexible conduit tube
18 Clay
19 Caulking box
20 Caulking material
21 Sealing fitting
22 Coupling
23 Compound
24 Bushing

What is claimed is:

1. An air shelter to protect electrical equipment at time of flooding by rain, flood or tsunami, the air shelter comprising: a base frame, a base, a cover body arranged at a periphery of the equipment to prevent submergence of the equipment, an electrical cable that supplies power to the equipment, and a conduit tube that protects the electrical cable; wherein the cover body has a roof portion, a side surface portion, and a bottom surface portion, and includes an opening on at least a part or all of the bottom surface portion or on the side surface at a location farther from the roof portion than the equipment, the cover body being a sealed structure such that fluid can enter the cover body only through the opening of the bottom surface or the side surface;

the electrical cable is passed through a vicinity of a lower end of the side surface portion or the bottom surface portion of the cover body from the equipment and connected to a power source; and the conduit tube includes a fluid admitter to allow fluid to enter the conduit tube to prevent air from leaking out of the air shelter when air pressure inside the air shelter is different than air pressure outside the air shelter, the fluid admitter comprising at least one of a terminating end of the conduit tube, a discontinuous portion of the conduit tube, or a portion of the conduit tube having permeability on a lower side of the air shelter than a position where the equipment is arranged in the inside or the lower side of the cover body.

2. The air shelter of claim 1, wherein an end of the conduit tube or a member connected to the end of the conduit tube is water tightly filled.

3. The air shelter of claim 2, further comprising a conduit tube connector for connecting the conduit tube to the cover body in the vicinity of a lower end of the side surface portion or the vicinity of the bottom surface portion of the cover body.

4. The air shelter of claim 1, further comprising a conduit tube connector for connecting the conduit tube to the cover body in the vicinity of a lower end of the side surface portion or the vicinity of the bottom surface portion of the cover body.

* * * * *